United States Patent [19]
Remson

[11] Patent Number: 5,097,143
[45] Date of Patent: Mar. 17, 1992

[54] BIPOLAR TO UNIPOLAR CONVERTER WITH AUTOMATIC GAIN CONTROL

[75] Inventor: Joseph D. Remson, San Jose, Calif.

[73] Assignee: Rolm Systems, Santa Clara, Calif.

[21] Appl. No.: 664,713

[22] Filed: Mar. 5, 1991

[51] Int. Cl.⁵ .............................. H03K 5/00; H03K 5/13
[52] U.S. Cl. .................................... 307/262; 307/359;
307/360
[58] Field of Search ................ 307/262, 354, 359, 360

[56] References Cited

U.S. PATENT DOCUMENTS

| | | | |
|---|---|---|---|
| 4,011,507 | 3/1977 | Rossell | 307/360 |
| 4,016,501 | 4/1977 | Jasinski et al. | 330/10 |
| 4,355,423 | 10/1982 | Theall | 375/87 |
| 4,652,833 | 3/1987 | Batts | 307/354 |
| 4,859,872 | 8/1989 | Hyakutake | 307/262 |

Primary Examiner—Eugene R. LaRoche
Assistant Examiner—Tan Dinh

[57] ABSTRACT

A circuit for translating bipolar signals into unipolar signals, in which the bipolar signals are applied to an amplifier whose gain is automatically controlled to produce bipolar signals of constant amplitude that are applied to two biased comparators for producing P DATA and N DATA signals of the same polarity. These signals are OR'd to provide R DATA signals.

14 Claims, 4 Drawing Sheets

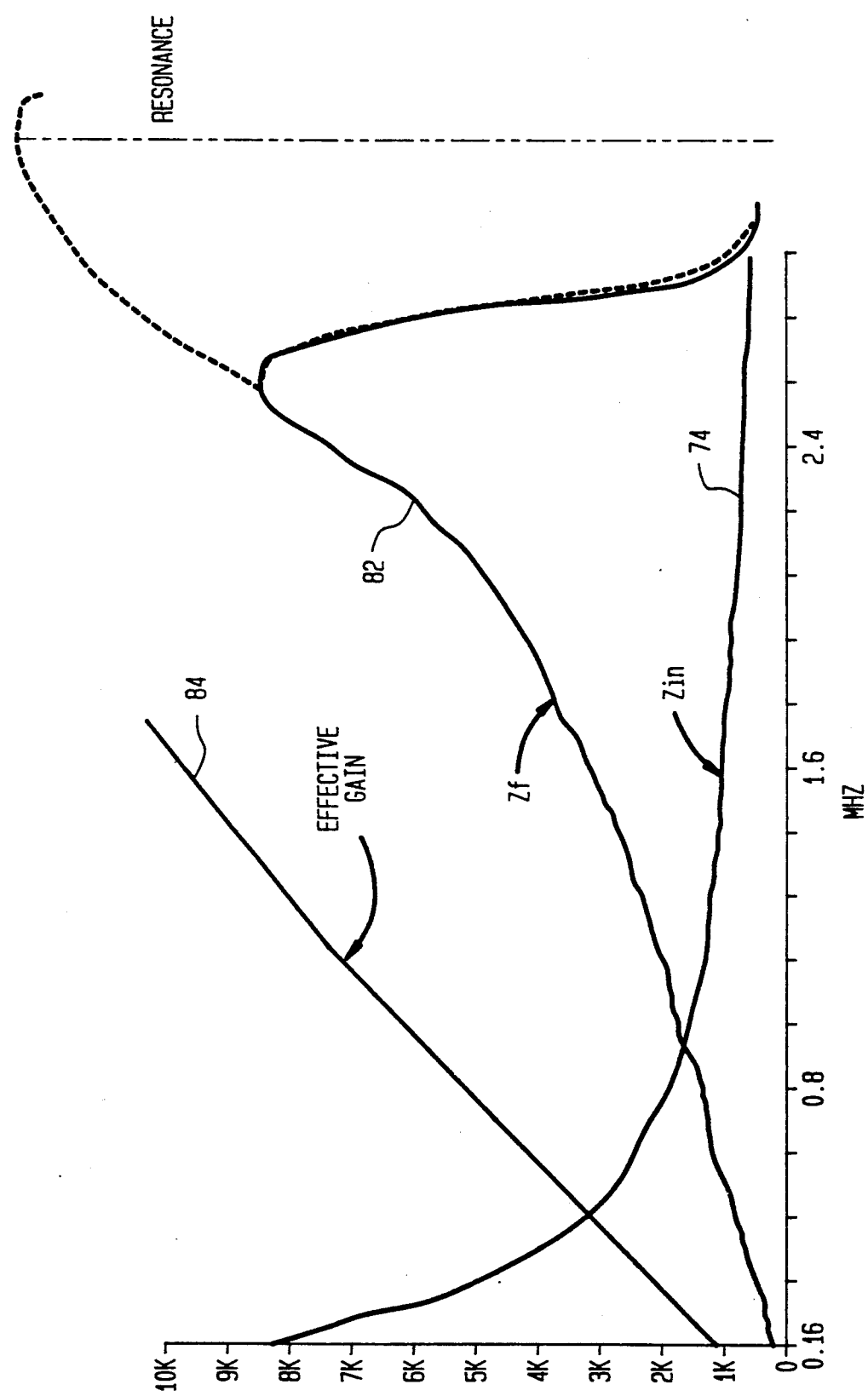

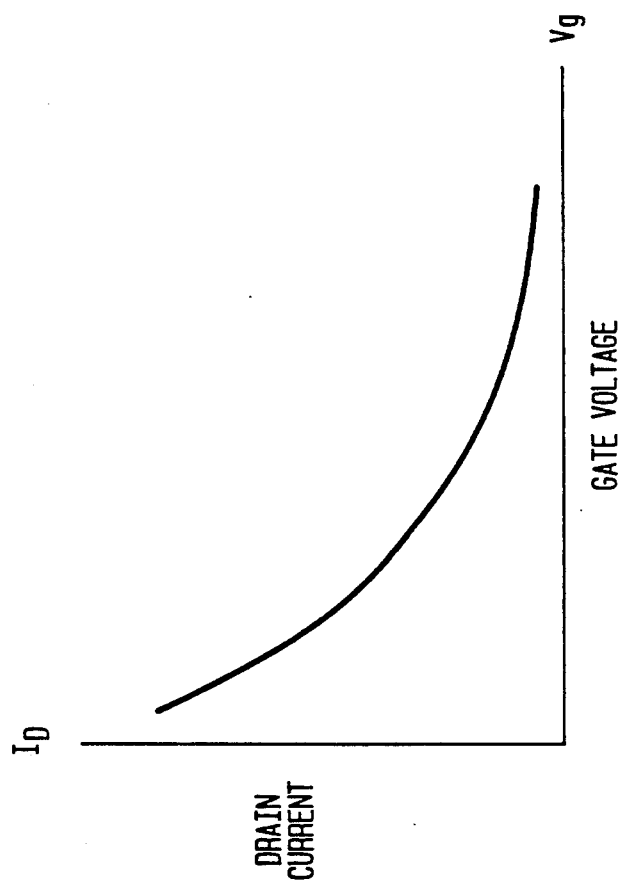

BIPOLAR TO UNIPOLAR CONVERTER WITH AUTOMATIC GAIN CONTROL

FIELD OF THE INVENTION

The field of the present invention relates generally to data transmission systems, and more particularly to such systems using bipolar modulation.

BACKGROUND OF THE INVENTION

One bipolar modulation technique for the transmission of digital information is known as Alternate Mark Inversion (AMI) in which positive pulses known as P DATA are separated from negative pulses known as N DATA by a zero reference. What is called R DATA is the OR'd combination of P DATA and N DATA. This serial format is usually divided into frames by the use of an intentional code violation in which two successive logical "ones" have the same polarity e.g., two successive P DATA pulses or two successive N DATA pulses. Such a format does not lend itself to direct application to digital equipment. Further difficulties are encountered because the amplitude of the pulses may vary by a ratio of as much as 50:1.

BRIEF SUMMARY OF AN EMBODIMENT OF THE INVENTION

In accordance with one object of this invention, a bipolar (AMI) signal is transformed or translated into unipolar pulses, one for each P DATA pulse, and one for each N DATA pulse, whereby unipolar R DATA pulses occur during each P DATA and each N DATA pulse. The bipolar signal is passed through an amplifier whose gain is controlled so as to produce a bipolar signal having P DATA and N DATA pulses of constant amplitude. Preferably, the bipolar signal is then passed through means for emphasizing the high frequencies so as to produce pulses with steep leading and trailing edges that are well suited for application to digital equipment. The unipolar pulses referred to are then derived by two comparators. One comparator is biased so as to produce pulses only in response to P DATA pulses in the bipolar signal, and the other comparator is biased so as to produce pulses only in response to the N DATA pulses. R DATA pulses are derived by respectively coupling the inputs of an OR gate to the outputs of the comparators.

BRIEF DESCRIPTION OF THE DRAWINGS

Various embodiments of the present invention are described with reference to the following drawings in which like items have the same reference designation, wherein:

FIGS. 3 and 4 show response curves associated with the operation of the gain controlled amplifier shown in FIG. 1.

DETAILED DESCRIPTION OF THE INVENTION

Figure 1:
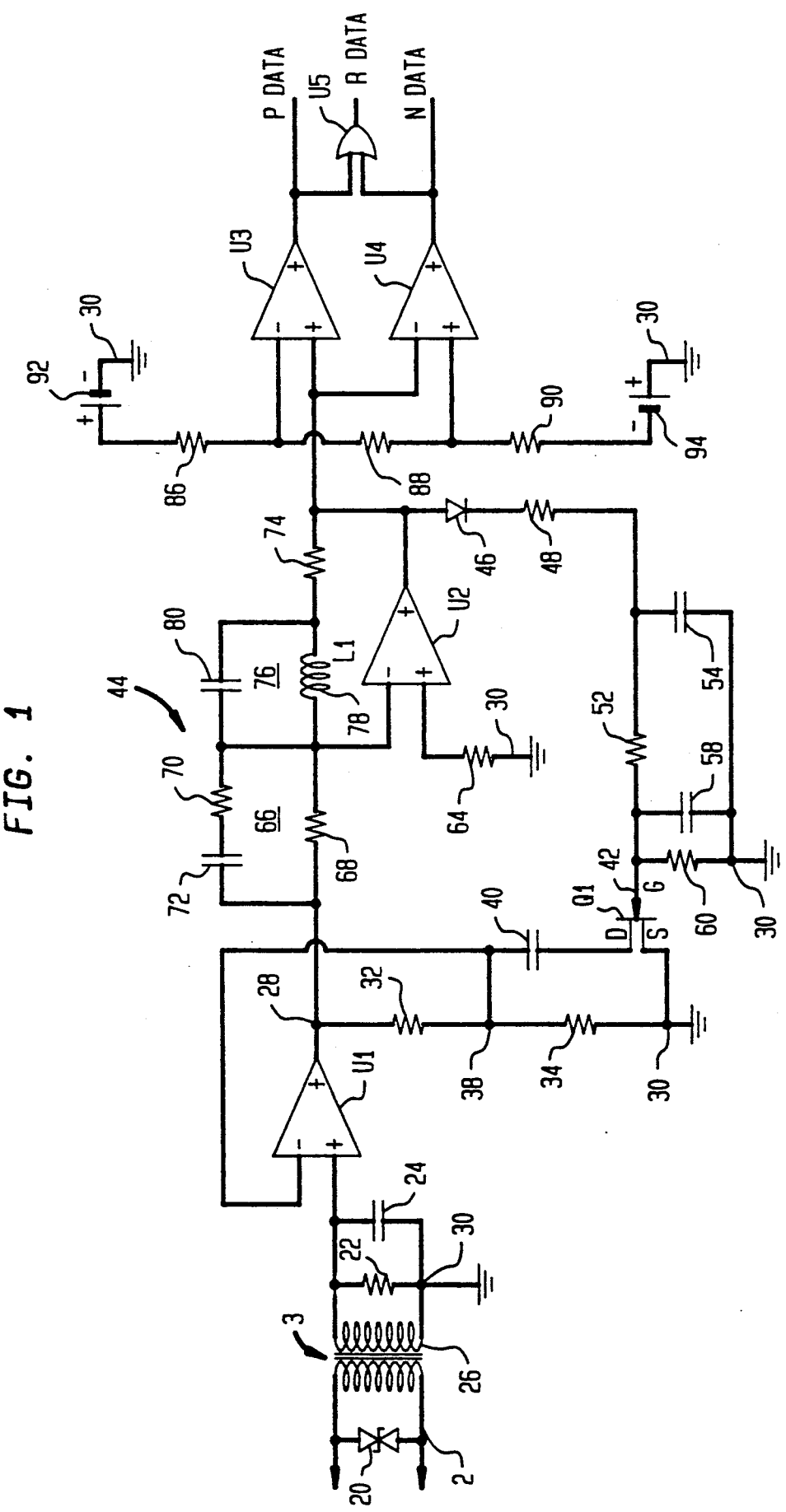
FIG. 1 is a schematic diagram of a circuit for translating bipolar signals into unipolar signals in accordance with one embodiment of this invention.
Figure 2A:
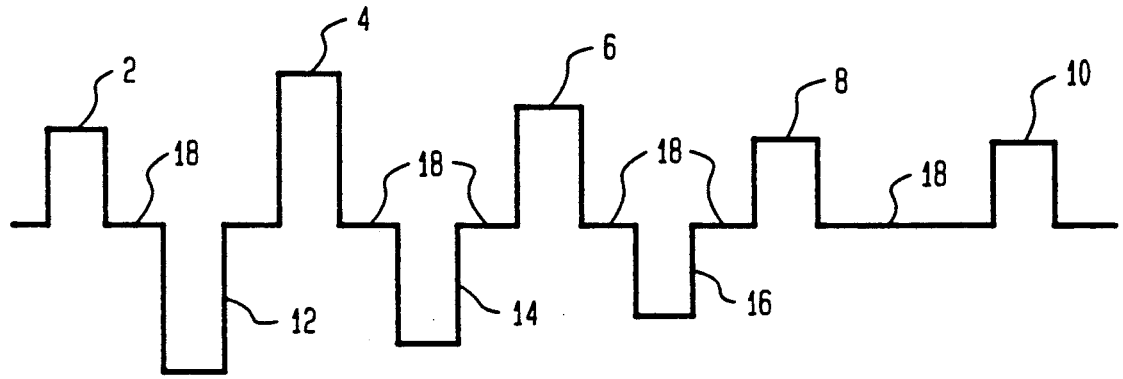
FIG. 2A illustrates a bipolar signal having amplitude variations.

In FIG. 1, a circuit is shown for transforming bipolar signals to unipolar signals in accordance with one embodiment of this invention. Bipolar signals from a source such as a telephone line are applied to a primary winding 2 of a transformer 3. As shown in FIG. 2A, these signals are comprised of positive P DATA voltage pulses 2, 4, 6, 8 and 10 and negative N DATA voltage pulses 12, 14 and 16. Zero voltages are indicated by the number 18 (at each point where number 18 is repeated). The successive P DATA pulses 8 and 10 indicate the end of a frame. Alternatively, successive N DATA pulses (not shown) could be used for this purpose. Furthermore, the successive pulses of like polarity can be spaced by any desired amount.

In order to prevent incoming transients from damaging the subsequent electronic circuitry, a protective device 20, such as oppositely poled Zener diodes are connected across the primary winding 2. A resistor 22 and a capacitor 24 are connected across a secondary winding 26 so as to provide an impedance match to the source of the bipolar pulses that is coupled to the primary winding 2.

Figure 2B:
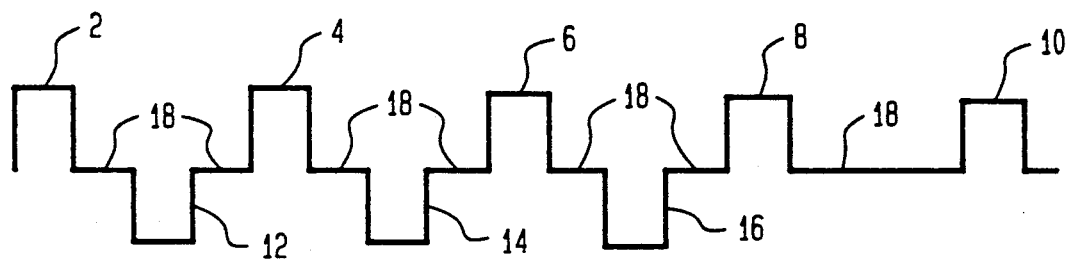
FIG. 2B illustrates a bipolar signal after it has passed through an automatic gain control circuit.

An operational amplifier U1 is operated so as to provide automatic gain control so that the P DATA (2, 4, 6, 8, 10) and N DATA (12, 14, 16) pulses appear at its output 28 with equal amplitudes as indicated in FIG. 2B. One end of the secondary winding 26 is connected to a point 30 of reference voltage (ground in this example), and its other end is connected to the non-inverting input of U1. Resistors 32 and 34 are connected in series between the output 28 and a point 30 of reference voltage, and their junction 38 is connected to the inverting input of U1. The gain of the circuit thus far described equals the sum of the resistances R32 and R34 of resistors 32 and 34, respectively, divided by the resistance of resistor 32, i.e., (R32+R34)/R32 Variations in gain are effected by varying the conductivity of a field effect transistor Q1 having its drain electrode connected via a capacitor 40 to the junction 38, and its source electrode to the point 30 of reference voltage. Q1 is biased to operate as a voltage controlled resistor so that its conductivity varies with voltage applied to its gate electrode. Thus, the impedance between the junction 38 and the point 30 of reference voltage changes, thereby changing the gain of U1.

The conductivity of Q1 is controlled by coupling the output 28 of U1 to the gate electrode 42 of Q1. In this particular embodiment of the invention, the output 28 is coupled via a means 44 for emphasizing high frequencies to a unilateral conducting device 46, a diode 46 in this example, that is poled to pass current in response to the positive P DATA pulses 2, 4, 6, 8 and 10 in FIG. 2. Resistors 48 and 52 are connected in series between the cathode of diode 46 and the gate 42 of Q1. A capacitor 54 is connected between a point 30 of reference voltage and the junction of the resistors 48 and 52. A capacitor 58 is connected between the point 30 of reference voltage, and the gate electrode 42. A resistor 60 is connected in parallel with the capacitor 58. The circuit components 48, 52, 54, 58 and 60 form a filter providing a voltage that follows the average amplitude of the P DATA pulses (2, 4, 6, 8, 10). When they increase in amplitude, the conductivity of Q1 decreases so as to effectively reduce the value of resistor 34 and thereby reduce the gain of U1. When the amplitude of the P DATA pulses (2, 4, 6, 8 and 10) decreases, the gain of U1 is increased. In FIG. 4, a curve of drain current $I_D$ versus gate voltage Vg is shown, for Q1, as an example.

The high frequency emphasis circuit 44 that is coupled between the output 28 of U1 and the device 46 includes an operational amplifier U2. Its non-inverting input is connected to a point 30 of reference voltage by a resistor 64, and its inverting input is coupled via an impedance circuit 66 to the output 28 of U1. The circuit 66 includes a resistor 68 connected in parallel with a series resistor 70 and capacitor 72 so as to have an impedance that decreases with frequency as indicated by a curve 74 of FIG. 3. The output of U2 is coupled to its inverting input via a resistor 74 and an impedance circuit 76. The circuit 76 is comprised of an inductor 78 connected in parallel with a capacitor 80 so as to have an impedance that increases with frequency as indicated by a curve 82 of FIG. 3. As a result, the gain of U2 increases with frequency as indicated by a curve 84 of FIG. 3.

Figure 2C:
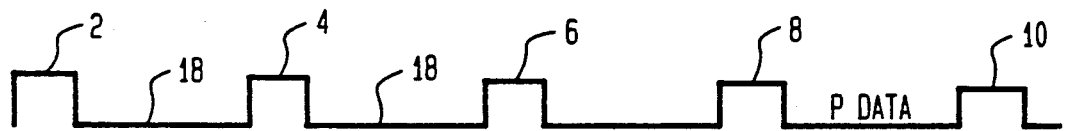
FIG. 2C illustrates unipolar P DATA pulses.
Figure 2D:
FIG. 2D illustrates unipolar N DATA pulses.
Figure 2E:
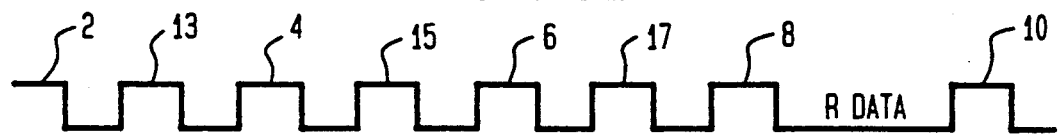
FIG. 2E illustrates unipolar R DATA pulses.

The following circuitry derives the desired unipolar signals from the bipolar signal appearing at the output of U2. Biasing resistors 86, 88 and 90 are connected in series between a source 92 of positive voltage and a source 94 of negative voltage. The output of U2 is connected to the non-inverting input of a comparator U3 and to the inverting input of a comparator U4. The inverting input of amplifier U3 is connected to the junction of the resistors 86 and 88, and the non-inverting input of U4 is connected to the junction of the resistors 88 and 90. P DATA pulses 2, 4, 6, 8 and 10, as shown in FIG. 2C appear at the output of U3, and polarity inverted N DATA pulses 13, 15, and 17 as shown in FIG. 2D appear at the output of U4. The inputs of an OR gate U5 are respectively connected to the outputs of U3 and U4 so as to produce the positive polarity R DATA pulses 2, 13, 4, 15, 6, 17, 8, and 10 as shown in FIG. 2E at its output.

Suggested values and/or part numbers/manufacturers of the components in FIG. 1 are listed below as follows:

| Resistors | Capacitors | Solid State Device |
| --- | --- | --- |
| 22 - 120 Ω* | 24 - .1 →2. μfd* | U1 - 412 |
| 32 - 1000 Ω | 40 - .1 μfd | U2 - 412 |
| 34 - 4900 Ω | 54 - .1 μfd | U3 - 319 |
| 48 - 10K | 58 - .47 μfd | U4 - 319 |
| 52 - 10K | 72 - 100 pf | U5 - 7432 |
| 60 - 10K | 80 - 82 pf | |
| 64 - 2700 | | |
| 68 - 3600 | | |
| 70 - 470 | | |
| 74 - 10K | | |
| 86 - 10K | | |
| 88 - 4K | | |
| 90 - 10K | | |

*Variable to line impedance

Although various embodiments of the present invention have been shown and described herein for purposes of illustration, they are not meant to be limiting. Those of skill in the art may recognize various changes and modifications to these embodiments that are meant to be covered by the spirit and scope of the appended claims.

What is claimed is:

1. A circuit for translating bipolar signals into unipolar signals comprising:
   a first amplifier having an input circuit and an output circuit;
   means coupled to said output circuit for controlling the gain of said amplifier so as to maintain the amplitude of signals appearing at said output circuit at a predetermined amplitude;
   means coupled to said output circuit for producing a unipolar voltage at a first terminal when the voltage at said output circuit has a first polarity;
   means coupled to said output circuit for producing a unipolar voltage at a second terminal when the voltage at said output circuit has a second polarity opposite to said first polarity; and
   means coupled to said first and second terminals for producing a unipolar voltage at a third terminal when a unipolar voltage is present at either of said first and second terminals.

2. A circuit as set forth in claim 1, wherein said unipolar voltages all have the same polarity.

3. A circuit as set forth in claim 1, wherein said means for producing a unipolar voltage at said first terminal is a comparator having inverting and non-inverting inputs and an output, said output being connected to said first terminal, and further comprising means for biasing said inverting input positively with respect to said non-inverting input.

4. A circuit as set forth in claim 3, wherein said means for producing a unipolar voltage at said second terminal is a comparator having inverting and non-inverting inputs and an output, said output being connected to said second terminal, and further comprising means for biasing said non-inverting input of said second comparator negatively with respect to its inverting input.

5. A circuit as set forth in claim 1, wherein said means for producing a unipolar voltage at said third terminal is an OR gate having its inputs respectively coupled to said first and second terminals.

6. A circuit as set forth in claim 1, further including:
   means for emphasizing higher frequencies coupled between the output circuit of said amplifier and both said first and second terminals for producing unipolar voltages at said first terminal and said means for producing unipolar voltages at said second terminal.

7. A circuit as set forth in claim 6, wherein said means for emphasizing high frequencies includes a second amplifier having an input terminal coupled to the output circuit of said first amplifier, and an output terminal coupled to said first and second terminals, and a high pass filter connected between said input and output terminals of said second amplifier.

8. A circuit for translating bipolar signals into unipolar signals comprising:
   a first amplifier having a non-inverting input, an inverting input and an output;
   a transformer having primary and secondary windings;
   a source of reference voltage;
   means for coupling said secondary winding between said non-inverting input of said first amplifier and said source of reference voltage;
   first and second gain control impedances connected in series between said output of said first amplifier and said source of reference potential, including a connection between the junction of said gain control impedances and the inverting input of said amplifier;
   a first comparator having non-inverting and inverting inputs and an output;

a second comparator having non-inverting and inverting inputs and an output;

a first source of voltage that is positive with respect to said reference potential;

a second source of voltage that is negative with respect to said reference potential;

first, second and third D.C. impedances connected in series in the order named between said first source of voltage and said second source of voltage;

a connection between the junction of said first and second D.C. impedances and the inverting input of said first comparator;

a connection between the junction of said second and third D.C. impedances and the non-inverting input of said second comparator;

means for coupling the output of said amplifier to the non-inverting input of said first comparator, and to the inverting input of said second comparator;

an OR gate having individual inputs connected to the outputs of said first and second comparators, respectively, said OR gate having an output;

a variable impedance connected in parallel with one of said gain control impedances; and means responsive to one polarity of the signals at the non-inverting input of said first comparator for changing the value of said variable impedance so as to tend to keep the amplitude of the last mentioned signals constant;

whereby said first comparator provides output signals of a first polarity in response to portions of said bipolar signals of said first polarity, and said second comparator provides output signals of said first polarity in response to portions of said bipolar signals of opposite polarity to said first polarity.

9. A circuit as set forth in claim 8, wherein said means for coupling the output of said amplifier to the non-inverting input of said first comparator includes means for emphasizing high frequencies.

10. A circuit as set forth in claim 9, wherein said means for emphasizing high frequencies is comprised of:
a second amplifier having an inverting input, a non-inverting input and an output;
means coupling the non-inverting input of said second amplifier to said source of reference potential;
a first impedance circuit that decreases in impedance value with frequency coupled between the inverting input of said second amplifier and the output of said amplifier;
a second impedance circuit that increases in impedance value with frequency coupled between the inverting input of said second amplifier and the output of said second amplifier; and
means coupling the output of said second amplifier to the non-inverting input of said first comparator.

11. A circuit for translating bipolar signals into unipolar signals, comprising:
terminals to which bipolar signals are to be coupled;
first and second comparators, each having an inverting input, a non-inverting input and an output terminal;
a source of reference potential;
means for referencing to the non-inverting input of said first comparator and the inverting input of said second comparator to said source of reference potential;
means for applying a first D.C. reference voltage to the inverting input of said first comparator that is positive with respect to said reference potential, and a second D.C. reference voltage to the non-inverting input of said second comparator that is negative with respect to said reference potential;
means connected to said terminals for coupling said bipolar signals to the non-inverting input of said first comparator, and to the inverting input of said second comparator; and
an OR gate having inputs respectively coupled to the output terminals of said first and second comparators, whereby output signals of said first comparator have a first polarity that is the same as first portions of said bipolar signals, and output signals of second comparator are of said first polarity relative to second portions of said bipolar signals of opposite polarity.

12. A circuit as set forth in claim 11, wherein said means for coupling said bipolar signals to the non-inverting input of said first comparator and to the inverting input of said second comparator includes a gain control means.

13. A circuit as set forth in claim 12, wherein said means for coupling said bipolar signals to the non-inverting input of said first comparator and to the inverting input of said second comparator includes a high frequency emphasis means.

14. A circuit for translating bipolar signals into unipolar signals comprising:
a first operational amplifier having inverting and non-inverting inputs and an output;
a transformer having primary and secondary windings;
a source of reference voltage;
means for coupling said secondary winding between said non-inverting input and said source of reference voltage;
first and second resistors connected in series in the order named between the output of said amplifier and said source of reference voltage;
a connection between the junction of said first and second resistors and said inverting input;
a second operational amplifier having inverting and non-inverting inputs and an output;
means coupling the non-inverting input of said second operational amplifier to said source of reference voltage;
a filter circuit including a first capacitor and a third resistor connected in parallel between the inverting input of said second operational amplifier and the output of said first operational amplifier;
a fourth resistor and an inductor connected in series between the output of said second operational amplifier and its inverting input;
a second capacitor connected in parallel with said inductor;
a series circuit comprised of the main current path of a field effect transistor and a third capacitor connected in parallel with said second resistor, said transistor having a gate electrode;
means including an RC filter and a unilateral conducting device coupling the output of said second operational amplifier to the gate electrode of said field effect transistor;
first and second comparators, each having an inverting input, a non-inverting input, and an output;
a connection between the output of said second operational amplifier, the non-inverting input of said first comparator and the inverting input of said second comparator;

a first source of D.C. voltage that is positive with respect to said reference voltage;

a second source of D.C. voltage that is negative with respect to said reference voltage;

first, second and third biasing resistors connected in series in the order named between said first and second sources of D.C. voltage;

a connection between the junction of said first and second biasing resistors and the inverting input of said first comparator;

a connection between the junction of said second and third biasing resistors and the non-inverting input of said second comparator; and an OR gate having inputs respectively connected to the outputs of said first and second comparators, the output signals of said first comparator being unipolar signals of a first polarity relative to individual portions of said bipolar signals having said first polarity, the output signals of said second comparator being unipolar signals of said first polarity relative to individual portions of said bipolar signals having a polarity opposite to that of said first polarity

* * * * *